United States Patent [19]

Yokoyama

[11] Patent Number: 4,785,257
[45] Date of Patent: Nov. 15, 1988

[54] POWER AMPLIFIER CIRCUIT FOR AN AUDIO CIRCUIT

[75] Inventor: Kenji Yokoyama, Hamamatsu, Japan

[73] Assignee: Nippon Gakki Seizo Kabushiki Kaisha, Japan

[21] Appl. No.: 54,828

[22] Filed: May 26, 1987

[30] Foreign Application Priority Data

Jun. 2, 1986 [JP] Japan .................. 61-127729

[51] Int. Cl.⁴ .......................... H03F 1/32; H03F 3/45
[52] U.S. Cl. .................... 330/149; 330/255; 330/260
[58] Field of Search ............ 330/156, 149, 255, 260, 330/265, 268, 271, 274

[56] References Cited

U.S. PATENT DOCUMENTS 4,476,442 10/1984 Iwamatsu ..................... 330/265
4,706,035 11/1987 Dijkmans ..................... 330/156

Primary Examiner—James B. Mullins
Attorney, Agent, or Firm—Darby & Darby

[57] ABSTRACT

A power amplifier circuit with less harmonic distortion factor and with remarkably high slew rate consists of a drive amplifier, an output amplifier, a distortion cancellation circuit, a negative feedback loop and a primary amplifier. The output amplifier having an impedance load is driven by the drive amplifier and performs the push-pull amplifier operation. The distortion cancellation circuit drives the impedance load with a voltage gain of "1", whereby the distortion cancellation circuit cancels the distortion included in the output voltage of the output amplifier based on the voltage difference between the input and output voltages of the output amplifier. Hence, the apparent gain of the output amplifier is infinite. The negative feedback loop feeds the output voltage back to the primary amplifier as a negative feedback voltage. The primary amplifier drives the drive amplifier based on the voltage difference between the arbitrary input voltage and the negative feedback voltage.

10 Claims, 6 Drawing Sheets

POWER AMPLIFIER CIRCUIT FOR AN AUDIO CIRCUIT

BACKGROUND OF THE INVENTION

1. Field of the Invention

The present invention generally relates to power amplifier circuits, and more particularly to a power amplifier circuit for an audio circuit whose distortion factor and slew rate can be improved by adding a simple circuit to a conventional power amplifier.

2. Prior Art

Conventionally, a power amplifier for an audio circuit requires a low distortion factor. In order to improve the distortion factor of the power amplifier, several methods are employed. According to a first method for improving the distortion factor, an open loop gain of the power amplifier is set as large as possible and the distortion factor thereof is set as small as possible. In addition, a feedback volume in a negative feedback loop (NFB) for the power amplifier is increased so that the NFB effects an improvement for the distortion factor.

According to a second method, a positive feedback loop (PFB) is provided to the power amplifier so that a value of an apparent gain of the power amplifier is set an infinite value. In addition, the NFB is provided to the power amplifier so that the NFB works as an ideal NFB, hence, the distortion factor is reduced.

In the above first method, in order to enlarge the open loop gain of the power amplifier, it is possible to employ a method in which the power amplifier is constituted by amplifiers (devices) having large amplification factor and another method in which the power amplifier is constituted by multistage amplifiers, for example. In the former method, there is a limitation in enlarging the open loop gain of the power amplifier because of a limitation in amplification characteristics of the devices. In the later method, as the stages of the amplifiers are increased, phase characteristics in a high frequency band of the power amplifier are deteriorated, whereby the power amplifier suffers a problem in that a transient intermodulation (TIM) distortion due to an unstable NFB and an excessive phase compensation is increased. Hence, in order to decrease the TIM distortion, there exists a limitation in enlarging the open loop gain of the power amplifier inevitably.

In the second method described before, the PFB is provided so that the distortion of the power amplifier is once increased, and the NFB reduces the increased distortion. Hence, there exists a limitation in an actual improvement effect. In addition, the second method is applied only to a primary stage portion within the power amplifier which amplifies a minute input voltage. And, the second method is used originally to reduce the increased distortion due to the PFB as small as possible and to maintain an amplification linearity of an amplifier element within the power amplifier as much as possible. Therefore, it is hard to expect that the slew rate of the power amplifier employing the second method can be improved because the PFB and NFB are provided only to the primary stage portion, and furthermore, the constitution of the power amplifier becomes complicated inevitably.

SUMMARY OF THE INVENTION

It is therefore a general object of the present invention to provide a power amplifier circuit in which the distortion factor thereof is reduced remarkably.

It is another object of the present invention to provide a power amplifier circuit which is remarkably improved in a drive ability and the slew rate thereof.

It is still another object of the present invention to provide a power amplifier circuit whose constitution is relatively simple and whose price is reasonable.

In an aspect of the present invention, there is provided a power amplifier for an audio circuit comprising: (a) a drive amplifier having an impedance load, the drive amplifier driving the impedance load by use of a first power voltage from a first power source so that a first input voltage is amplified in the drive amplifier wherein the amplified first input voltage is outputted as a first output voltage; (b) an output amplifier being driven by the first output voltage so that the output amplifier outputs the amplified first output voltage as a second output voltage; (c) a distortion cancellation circuit for driving the impedance load with a voltage gain of "1" by use of a second power voltage from a second power source based on a first voltage difference between the first output voltage and the second output voltage, whereby a distortion included in the second output voltage is canceled by the distortion cancellation circuit; and (d) a negative feedback loop for negatively feeding back the second output voltage to a primary amplifier as a negative feedback voltage, the primary amplifier generating the first input voltage based on a second voltage difference between the negative feedback voltage and an arbitrary input voltage.

BRIEF DESCRIPTION OF THE DRAWINGS

Further objects and advantages of the present invention will be apparent from the following description, reference being had to the accompanying drawings wherein preferred embodiments of the present invention are clearly shown.

In the drawings:

FIGS. 3A to 6A respectively show input and output waveforms of the conventional power amplifier circuit according to experimental results;

FIGS. 3B to 6B respectively show input and output waveforms of the embodiment shown in FIG. 2 according to experimental results;

DESCRIPTION OF THE PREFERRED EMBODIMENTS OF THE INVENTION

Figure 1:
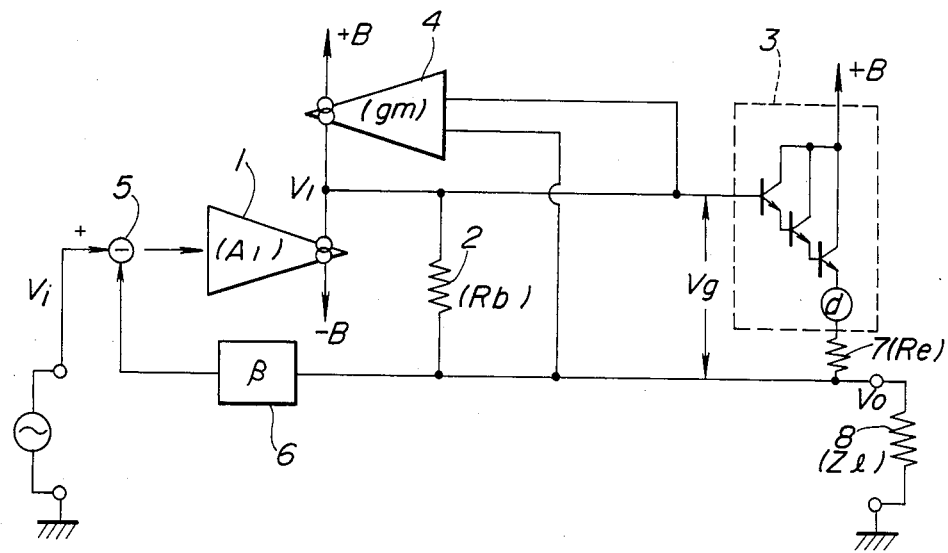
FIG. 1 is a circuit diagram of a first embodiment of the present invention.

Referring now to the drawings, wherein like reference characters designate like or corresponding parts throughout the several views, FIG. 1 shows a first embodiment of the invention.

In FIG. 1, an output terminal of a drive amplifier 1 is connected to an input terminal of a output amplifier 3 via a resistor 2 (or an impedance load 2) having resistance $R_b$. The output amplifier 3 consists of a TTL circuit, and the output amplifier 3 is driven from $-B$ power terminal by the drive amplifier 1 via the resistor 2.

In addition, a distortion cancellation circuit 4 is connected between the drive amplifier 1 and the output amplifier 3. A difference voltage between input and output voltages of the output amplifier 3 is inputted into the distortion cancellation circuit 4, hence, the resistor 2 is driven from $+B$ power terminal via the distortion cancellation circuit 4 having a voltage gain of "1".

Furthermore, a primary amplifier 5 is connected to an input terminal of the drive amplifier 1, and a negative feedback loop 6 is connected between an output terminal of the output amplifier 3 and the primary amplifier 5 so that the output voltage of the output amplifier 3 is negatively fed back to the primary amplifier 5.

When a gain of the drive amplifier 1 denotes $A_1$, a negative feedback volume of the negative feedback loop 6 denotes $\beta$, an input voltage of the primary amplifier 5 denotes $V_i$ and the output voltage of the output amplifier 3 denotes $V_o$, the output voltage $V_1$ of the drive amplifier 1 can be expressed as the following formula (1).

$$V_1 = A_1 \cdot (V_i - \beta V_o) \qquad (1)$$

In addition, when a mutual conductance of the distortion cancellation circuit 4 denotes gm, the difference voltage $V_g$ inputted into the distortion cancellation circuit 4 can be expressed as the following formula (2).

$$V_g = V_g \cdot gm \cdot R_b + \alpha V_1 \qquad (2)$$

The above $\alpha V_1$ is an additional voltage which is added between the input and output terminals of the output amplifier 3 by the output voltage $V_1$ of the drive amplifier 1.

As it can be considered that the output amplifier 3 drives a resistor 8 (a load 8) having a resistance Z1 via the resistor 7 (having the resistance of $R_e$), the following formula (3) can be obtained.

$$V_g = (V_o/Zb\ 1) \cdot R_e + d \qquad (3)$$

The above d denotes a distortion voltage generated in the output amplifier 3.

When canceling the difference voltage $V_g$ from the formulas (2) and (3), the following formula (4) can be obtained.

$$V_o = Z_1 \cdot \alpha \cdot V_1/[(1 - gm \cdot R_b) \cdot R_e] - (Z1/R_e) \cdot d \qquad (4)$$

Furthermore, when putting the output voltage $V_1$ shown by the formula (1) in the place of $V_1$ within the formula (4), the output voltage $V_o$ can be expressed as the following formula (5).

$$V_o = V_i \cdot A_1$$
$$(\alpha \cdot Z1)/[Z1 \cdot A_1 \cdot \alpha \cdot \beta + R_e \cdot (1 - gm \cdot R_b)]$$
$$)] - d \cdot (1 - gm \cdot R_b)/[(R_e/Z1) \cdot (1 - gm \cdot R_b) + A_1 \cdot \alpha \cdot \beta] \qquad (5)$$

The distortion cancellation circuit 4 drives the resistor 2 by use of the gain "1", in the above formula (5), hence, $gm \cdot R_b = 1$. Therefore, the formula (5) can be converted into the following simple formula (6).

$$V_o = V_i/\beta \qquad (6)$$

It is apparent from the above formula (6) that the output voltage $V_o$ can be univocally determined by use of only the input voltage $V_i$ and the negative feed back volume $\beta$, and the output voltage $V_o$ is not varied by other values. In other words, this power amplifier circuit according to the first embodiment generates no distortion in principle.

On the other hand, the drive constitution of the first embodiment is identical to that of a push-pull amplifier in that the output amplifier 3 is driven from the $-B$ power terminal by the drive amplifier 1 and is also driven from the $+B$ power terminal by the distortion cancellation circuit 4. Hence, the first embodiment is superior in the drive ability, and the slew rate (i.e., the rising and falling characteristics) of the power amplifier circuit is remarkably improved. In this connection, the slew rate of the power amplifier embodiment is practically determined by characteristics of the drive constitution thereof.

Next, description will be given with respect to a specific circuit diagram of the first embodiment of the invention in conjunction with FIG. 2.

Figure 2:
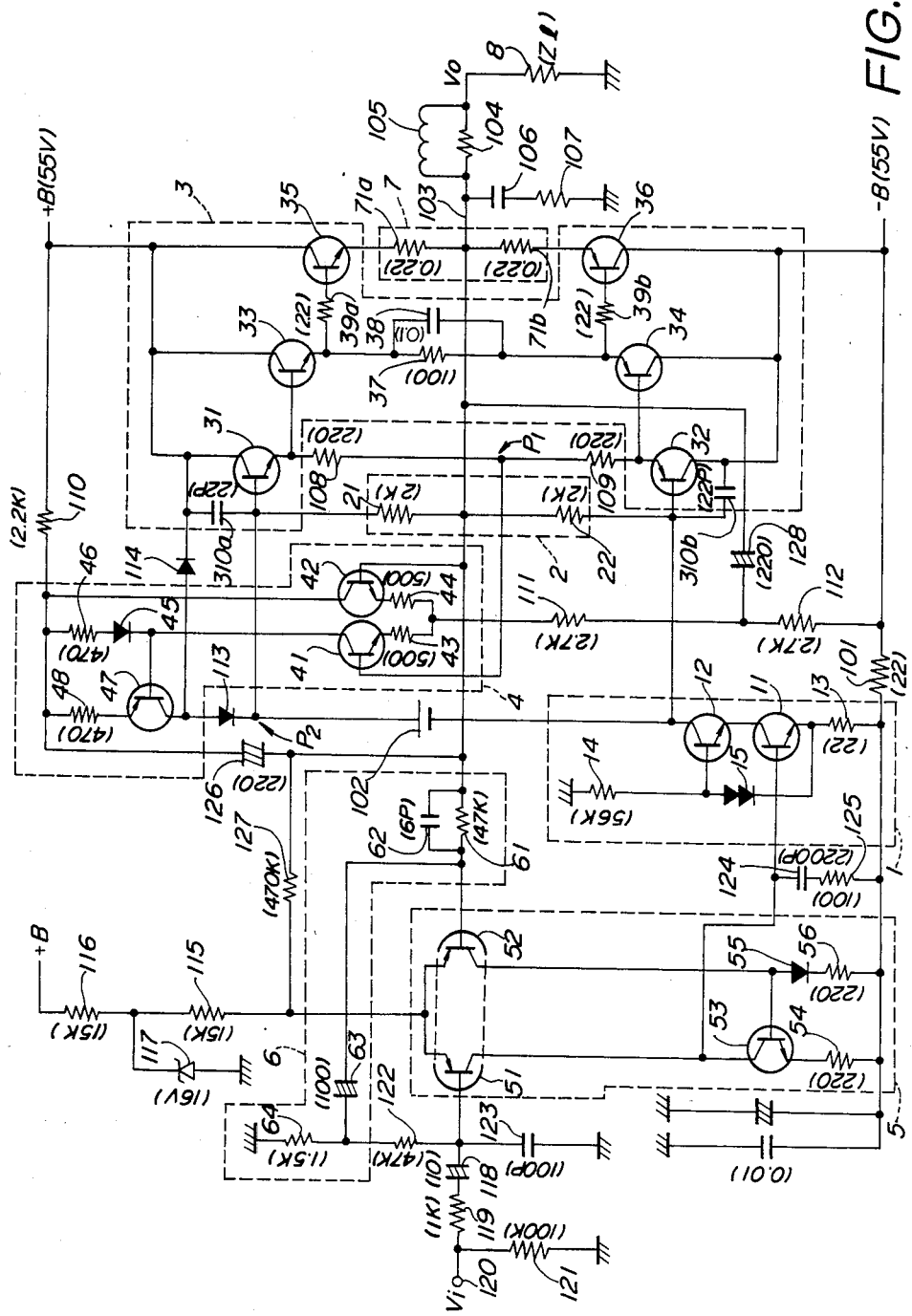
FIG. 2 is a specific circuit diagram of the first embodiment shown in FIG. 1.

In FIG. 2, the drive amplifier 1 consists of NPN transistors 11 and 12 which are connected in a cascade connection, an emitter resistor 13 (having a resistanc of 22 ohm), a resistor 14 (having a resistance of 56 ohm) and a diode 15. The base of the transistor 12 is grounded on earth via the resistor 14. The diode 15 is connected between the base of the transistor 12 and the emitter of the transistor 11. The emitter of the transistor 11 is connected to a negative power source (whose voltage $-B$ equals to $-55$ V) via a resistor 101 (having a resistance of 22 ohm). The collector of the transistor 12 is connected to an input terminal of the output amplifier 3.

The output amplifier 3 includes a couple of NPN transistor 31 and PNP transistor 32, a couple of NPN transistor 33 and PNP transistor 34 and a couple of NPN transistor 35 and PNP transistor 36 therein. In each couple of two transistors, one transistor works as a complementary circuit for another transistor. In addition, a parallel circuit consisted of a resistor 37 (having a resistance of 100 ohm) and a capacitor 38 (having a capacitance of 0.1 µF) is connected between the emitter of transistor 33 and the emitter of transistor 34. Furthermore, a resistor 39a (having a resistance of 2.2 ohm) is connected between the emitter of transistor 33 and the base of transistor 35, and a resistor 39b (having a resistance of 2.2 ohm) is connected between the emitter of transistor 34 and the base of transistor 36.

The base of transistor 31 is connected to the collector of transistor 12 via a bias voltage source 102, and the base of transistor 32 is directly connected to the collector of transistor 12. Resistors 21 and 22 (both having the same resistance of 2 kilo-ohm) work as impedance loads and are both connected to an output line 103. The base of transistor 31 is connected to the output line 103 via the resistor 21, and similarly, the base of transistor 32 is connected to the output line 103 via the resistor 22. The emitters of transistors 31 and 32 are connected to the bases of transistors 33 and 34, respectively. Resistors 71a and 71b (both having the same resistance of 0.22 ohm) are both connected to the output line 103. The emitter of transistor 35 is connected to the output line 103 via the resistor 71a, and similarly, the emitter of transistor 36 is connected to the output line 103 via the resistor 71b. One edge of the output line 103 is connected to a load 8 (having a resistance of Z1) via a parallel circuit constituted by an oscillation preventing resistor 104 and a coil 105. In addition, this one edge of the output line 103 is grounded via a serial circuit constituted by a oscillation preventing capacitor 106 and a resistor 107.

The collectors of transistors 31, 33 and 35 are connected to a positive power source (+B=+55 V), and the collectors of transistors 32, 34 and 36 are connected to a negative power source (−B=−55 V). A phase compensating capacitor 310a is connected between the base and the collector of transistor 31, and a phase compensating capacitor 310b is connected between the base and the collector of transistor 32. Both of these capacitors 310a and 310b have the same capacitance of 22 pF. A serial circuit constituted by resistors 108 and 109 (both have the same resistance of 220 ohm) is connected between the emitters of transistors 31 and 32.

Next, description will be give with respect to the constitution of the distortion cancellation circuit 4 connected between the drive amplifier 1 and the output amplifier 3.

The distortion cancellation circuit 4 diagrammatically consists of a differential amplifier and a current mirror circuit. The differential amplifier is constituted by NPN transistors 41 and 42 both of which have emitter resistors 43 and 44 (both have the same resistance of 500 ohm). Due to the current mirror circuit, a current identical to a collector current of the transistor 41 flows into a connection point P₂ of the base of transistor 31 and the bias voltage source 102 via an overvoltage protecting diode 113 in a forward direction. This current mirror circuit is constituted by a PNP transistor 47, a diode 45 and resistors 46 and 48 (both have the same resistance of 470 ohm). The emitter of transistor 47 is connected to the anode of diode 45 via the resistors 48 and 46 in series, and the cathode of diode 45 is connected to the base of transistor 47 and the collector of transistor 41. In addition, the collector of transistor 42 and a connection point between the resistors 46 and 48 are both connected to the positive power source +B via a resistor 110 (having the resistance of 2.2 kilo-ohm). On the other hand, a connection point between the resistors 43 and 44 is connected to the negative power source −B via resistors 111 and 112 (both have the same resistance of 2.7 kilo-ohm) in series. The collector of transistor 47 is connected to the connection point P₂ via the diode 113 and is also connected to a connection point between the capacitor 310a and the collector of transistor 31 via an overvoltage protecting diode 114 in a forward direction.

The primary amplifier 5 connected before the drive amplifier 1 is constituted by a current mirror circuit and a PNP dual transistor in which transistors 51 and 52 work as a differential amplifier. The collector currents of the transistors 51 and 52 is controlled to the same current by the current mirror circuit. This current mirror circuit consists of a NPN transistor 53, a diode 55 and resistors 54 and 56 (both have the same resistance of 220 ohm). The collector of transistor 51 is connected to the collector of transistor 53. The anode of diode 55 is connected to the collector of transistor 52 and the base of transistor 53, and the cathode of diode 55 is connected to the emitter of transistor 53 via the resistors 54 and 56 in series. A connection point between the resistors 54 and 56 is connected to the negative power source −B via the resistor 101. On the other hand, a connection point between the emitters of the transistors 51 and 52 is connected to the positive power source +B via resistors 115 and 116 (both have the same resistance of 15 kilo-ohm) in series. In addition, a connection point between the resistors 115 and 116 is grounded via a Zener diode 117 (having a Zener voltage of +16 V) in a reverse direction.

Furthermore, the base of transistor 51 is connected to an input terminal 120 via an input capacitor 118 (having a capacitance of 10 μF) and a resistor 119 (having a resistance of 1 kilo-ohm) in series. A connection point between the input terminal 120 and the resistor 119 is grounded via an input resistor 121 (having a resistance of 100 kilo-ohm).

The negative feedback loop 6 is connected between the base of transistor 52 and the output line 103. This negative feedback loop 6 consists of a resistor 61 (having a resistance of 47 kilo-ohm), an oscillation preventing capacitor 62 (having a capacitance of 6 pF), a capacitor 63 (having a capacitance of 100 μF) and a resistor 64 (having a resistance of 1.5 kilo-ohm). A parallel circuit constituted by the resistor 61 and the oscillation preventing capacitor 62 is connected between the base of transistor 52 and the output line 103. A connection point among the base of transistor 52, the resistor 61 and the oscillation preventing capacitor 62 is grounded via the capacitor 63 and the resistor 64 in series. A connection point between the capacitor 63 and the resistor 64 is connected to the base of transistor 51 via a resistor 122 (having a resistance of 47 kilo-ohm) and an oscillation preventing capacitor 123 (having a capacitance of 100 pF) is connected between the base of transistor 51 and the ground potential.

A connection point between the collectors of the transistors 51 and 53 is connected to the base of transistor 11 within the drive amplifier 1 so that the drive amplifier 1 is driven by an output voltage of the transistor 51.

As described before, the base of transistor 51 is grounded via the oscillation peventing capacitor 123. In addition, a connection point between the collector of transistor 53 and the base of transistor 11 is connected to a connection point among the resistors 54, 56, 13 and 101 via a capacitor 124 (having a capacitance of 2200 pF) and a resistor 125 (having a resistance of 100 ohm) in series. Hence, the primary amplifier 5 is preventing from oscillating.

The connection point between the resistors 46 and 48 within the distortion cancellation circuit 4 is connected to the output line 103 via a bootstrap capacitor 126 (having a capacitance of 220 μF). In addition, the connection point between the transistors 51 and 52 within the primary amplifier 5 is connected to the output line 103 via a resistor 127 (having a resistance of 470 kilo-ohm). Furthermore, the connection point between the resistors 111 and 112 is connected to the output line 103 via a capacitor 128 (having a capacitance of 220 μF).

Next, description will be given with respect to the operation of the specific circuit of the first embodiment shown in FIG. 2.

The input voltage $V_i$ is inputted into the input terminal 120 and is amplified by the primary amplifier 5, so that the drive amplifier 1 is driven by the output voltage of the primary amplifier 5.

The amplified input voltage $V_i$ is further amplified in the drive amplifier 1, so that the output amplifier 3 is driven by the output voltage of the drive amplifier 1.

Therefore, the output amplifier 3 amplifies the output voltage from the drive amplifier 1 and outputs the output voltage $V_o$ on the output line 103.

When there is no voltage difference between the output line 103 and the connection point $P_1$ between the resistors 108 and 109 (i.e., a central intermediate point $P_1$ between the complementary transistors 31 and 32, namely, an input point $P_1$ of the output amplifier 3). In other words, there is no voltage difference between the input voltage and the output voltage of the output amplifier 3, and there is no distortion occurred in the output amplifier 3, then the same collector current (i.e., the half of the common current at the connection point between the resistors 43 and 44) flows into the collectors of the transistors 41 and 42 within the distortion cancellation circuit 4. Due to the current mirror circuit in the distortion cancellation circuit 4, the current from the collector of transistor 47 which is identical to the collector current of the transistor 41 flows into the connection point $P_2$ among the bias power source 102, the resistor 21, the capacitor 310a and the base of transistor 31 via the diode 113.

In the above state, the distortion cancellation circuit 4 is therefore prevented from performing a substantial drive operation for the complementary transistors 31 and 32 within the output amplifier 3.

On the other hand, in the case where a voltage difference is produced between the output line 103 and the input point $P_1$ between the complementary transistors 31 and 32, values of the collector currents of the transistors 41 and 42 vary in response to the voltage difference. Hence, the value of the current from the collector of transistor 47 varies.

In the above state, the value of the ac impedance towards the resistors 21 and 22 viewed from the connection point $P_2$ is equal to 1 kilo-ohm because the resistors 21 and 22 both having the same resistance of 2 kilo-ohm are connected in parallel to the output line 103 with respect to an ac signal. In addition, the emitter resistors 43 and 44 of the transistors 41 and 42 have the same resistance of 500 ohm. In conclusion, the distortion cancellation circuit 4 drives the resistors 21 and 22 with a voltage gain "1".

Due to the distortion cancellation circuit 4, the potential at the input point $P_1$ follows up the potential at the output line 103.

Therefore, the current from the collector of transistor 47 must flow into the connection point $P_2$ and the value thereof must vary so as to reduce the value of the voltage difference between the input point $P_1$ and the output line 103, so that the distortion caused by the output amplifier 3 will be eliminated.

In other words, the output amplifier 3 has the apparent gain the value of which is equal to infinite.

Therefore, the total gain of the power amplifier shown in FIG. 2 is determined by the negative feedback loop 6.

The distortion cancellation circuit 4 performs the driving operation by use of the positive power source +B, and the drive amplifier 1 performs the driving operation by use of the negative power source −B. The distortion cancellation circuit 4 and the drive amplifier 1 performs the push-pull driving operation on the output amplifier 3 substantially and a driving ability thereof is extremely high, so that the slew rate of this power amplifier becomes remarkably large.

The capacitor 126 cooperates with the resistor 110 and performs a bootstrap operation at the connection point $P_2$ between the bias voltage source 102 and the base of transistor 31, so that the driving ability and the dynamic range of the power amplifier become large. The diodes 113 and 114 prevent the transistor 31 from being broken down. Because the potential state between the base and the emitter of the transistor 31 is subjected to the reverse bias state and the transistor 31 is broken down simultaneously when the collector voltage of the transistor 47 exceeds the positive power voltage +B under the effect of the above bootstrap operation.

The experimental results obtained by use of an oscilloscope, more specifically, the waveforms of the distorted output signals and the waveforms of the input sine-wave signals are shown in FIGS. 3A to 6A and FIGS. 3B to 6B. FIGS. 3A to 6A show the above-mentioned waveforms of the conventional power amplifier and FIGS. 3B to 6B show the above-mentioned waveforms of the power amplifier shown in FIG. 2.

Figures 3A, 3B:
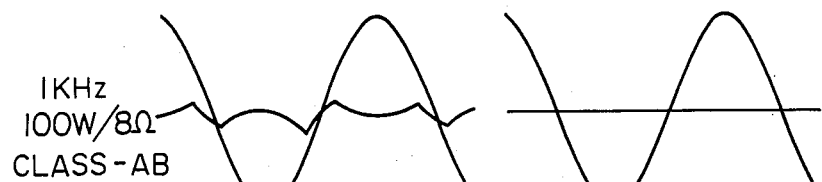
Figures 4A, 4B:
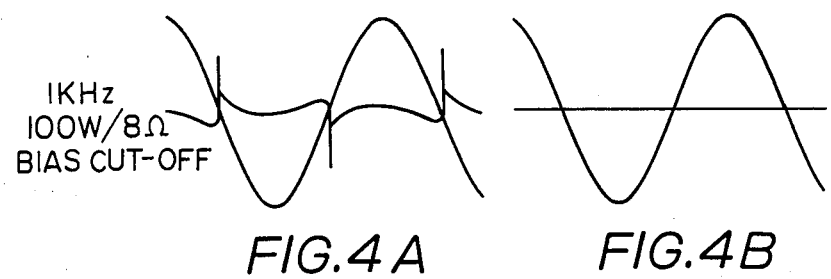
Figures 5A, 5B:
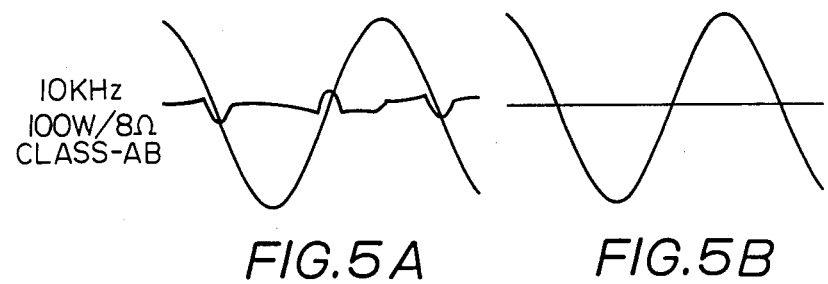
Figures 6A, 6B:
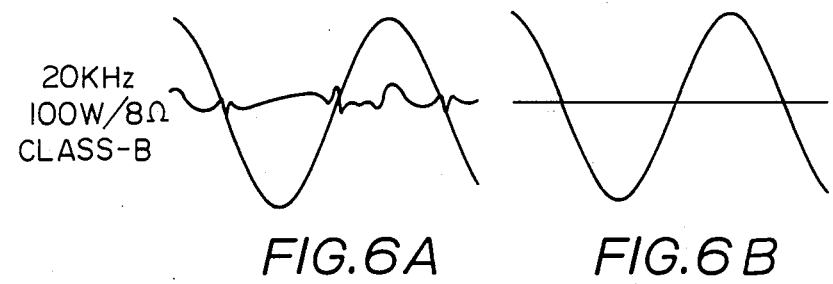

FIGS. 3A and 3B designates the case where the power amplifier employs the class-AB operation (i.e., the bias current equals to 0.5 A) and the input sine-wave frequency equals to 1 kHz. FIGS. 4A and 4B designates the case where the power amplifier employs the bias cut-off operation (i.e., the bias current equals to 0 A) and the input sine-wave frequency equals to 1 kHz. FIGS. 5A and 5B designates the case where the power amplifier employs the above class-AB operation and the input sine-wave frequency equals to 10 kHz. FIGS. 6A and 6B designates the case where the power amplifier employs the class-B operation and the input sine-wave frequency equals to 20 kHz. In all cases shown in FIGS. 3A to 6A and FIGS. 3B to 6B, the output power levels of the power amplifier are set to the same power level of 100 W/8-ohm.

Figure 7:
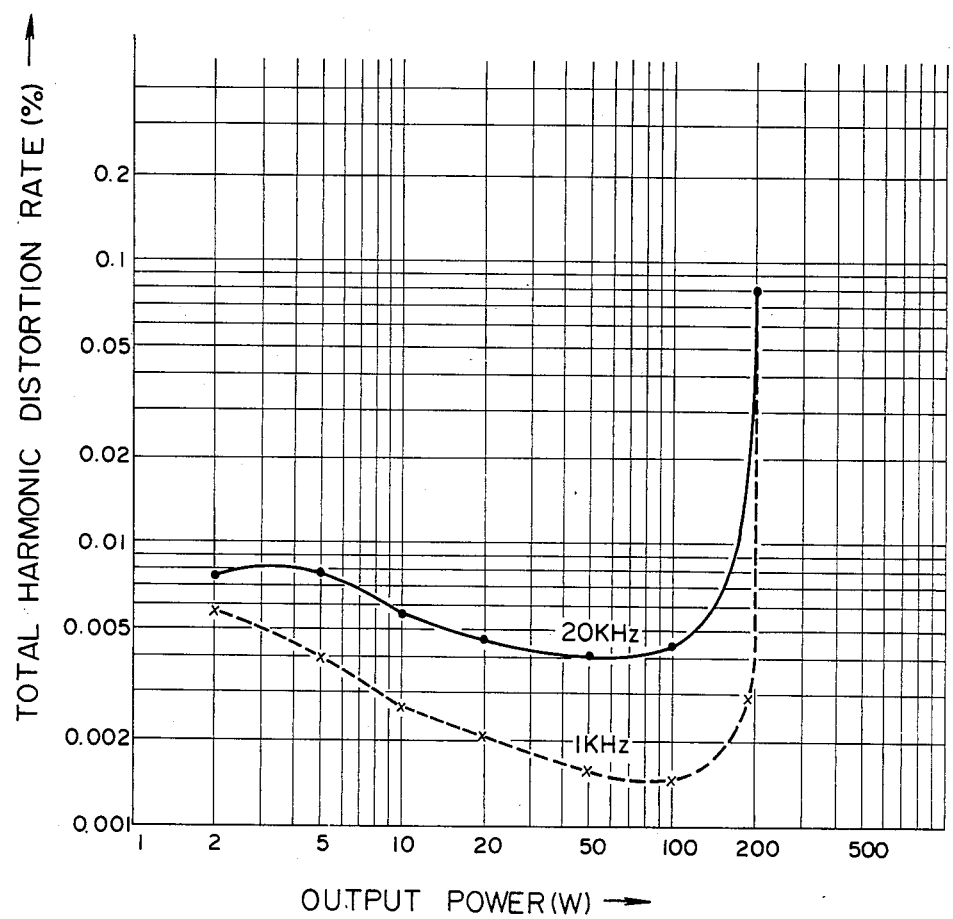
FIG. 7 is a graph showing characteristics between an output power and a total harmonic distortion rate of the conventional power amplifier circuit according to experimental results.
Figure 8:
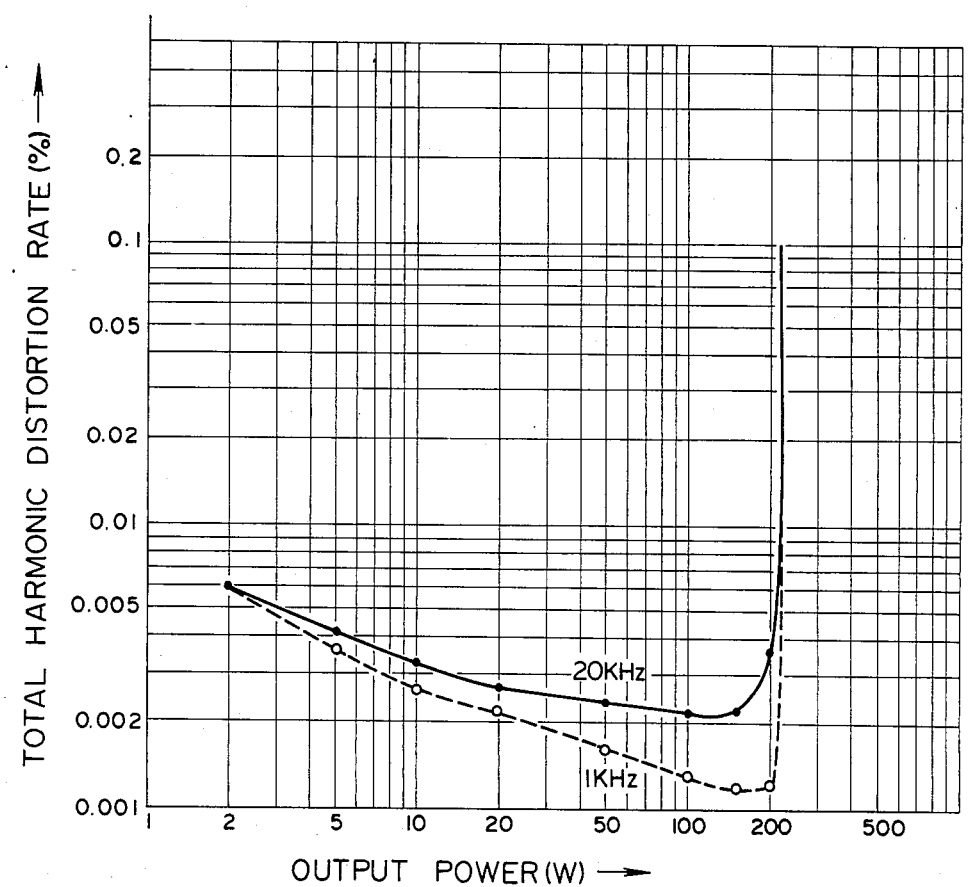
FIG. 8 is a graph showing characteristics between an output power and a total harmonic distortion rate of the embodiment shown in FIG. 2 according to experimental results.

FIGS. 7 and 8 show the experimental results for the relations between the output power and the total harmonic distortion rate in the case where the input sine-wave frequencies are set to 1 kHz and 20 kHz. FIG. 7 shows the above experimental results of the conventional power amplifier, and FIG. 8 shows the above experimental results of the power amplifier shown in FIG. 2.

In FIGS. 7 and 8, y-axis designates the total harmonic distortion rate (unit:%, logarithm values) and x-axis designates the output power (unit:W).

It is obvious from FIGS. 3A to 6A, FIGS. 3B to 6B and FIGS. 7 and 8 that the distortion rate is reduced to the remarkably low rate in the power amplifier according to the present invention while the distortion rate is relatively high in the conventional power amplifier.

In addition, it is obvious from differences between large amplitude characteristics shown in FIGS. 7 and 8 that the slew rate is relatively high in the power amplifier according to the present invention.

The reason why the distortion rate is remarkably low and the slew rate is relatively high in the present power amplifier can be described as follows. In the present power amplifier, the output amplifier 3 has apparent gain the value of which is infinite under the effect of the distortion cancellation circuit 4. As a result, the distortion level must be reduced to approximately zero level under the effect of the negative feedback loop 6. In addition, the output amplifier 3 is strongly driven by the push-pull driving circuit including the drive amplifier 1 and the distortion cancellation circuit 4.

In the embodiment shown in FIG. 2, when the bias voltage source 102 is omitted, the distortion level is slightly raised. However, the raised distortion level is such a small level that this raised distortion level can be reduced with ease by connecting a RC circuit (a parallel circuit constituted by a resistor and a capacitor) to an output terminal (not shown) of the power amplifier shown in FIG. 2.

In addition, the gain of the distortion cancellation circuit 4 is set to "1", and it is unnecessary to set the gain of the distortion cancellation circuit 4 to infinite. Hence, the distortion cancellation circuit 4 can be constituted with ease, and the embodiment shown in FIG. 2 is advantageous in the practical use.

Figure 9:
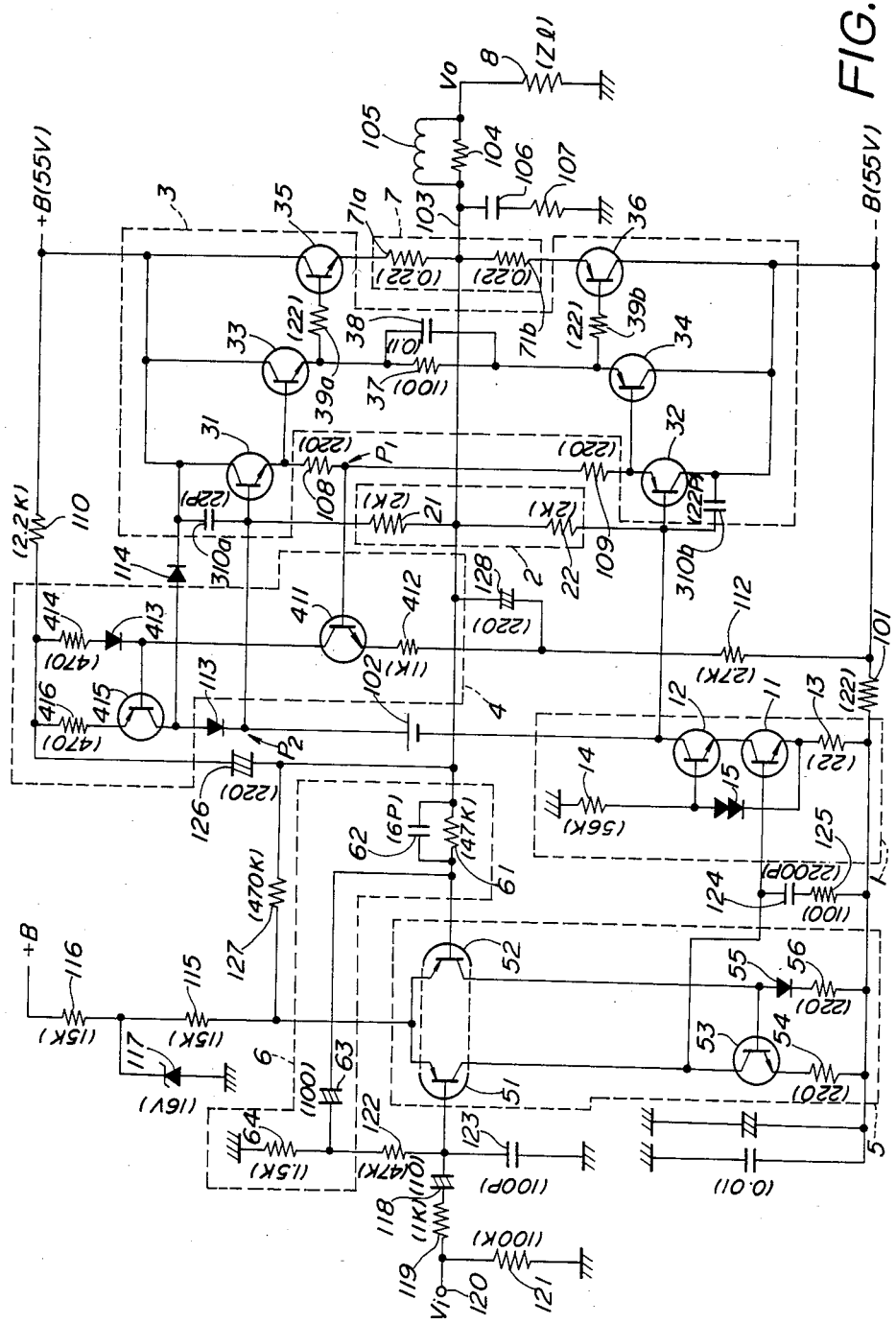
FIG. 9 is a circuit diagram showing a second embodiment of the present invention.

FIG. 9 shows a second embodiment of the present invention.

The difference between this second embodiment shown in FIG. 9 and the first embodiment shown in FIG. 2 is the constitution of the distortion cancellation circuit 4, and other circuits are same.

Next, description will be given with respect to the distortion cancellation circuit 4 shown in FIG. 9.

The distortion cancellation circuit 4 consists of a NPN transistor 411, a resistor 412 (having a resistance of 1 k), a diode 413, resistors 414 and 416 (both having the same resistance of 470 ohm) and a PNP transistor 415. The emitter of transistor 411 is connected to the negative power source −B via the resistors 412 and 112 in series. A connection point between the resistors 412 and 112 is connected to the output line 103 via the capacitor 128. The collector of transistor 411 is connected to the base of transistor 415 and the cathode of diode 413. The anode of diode 413 is connected to the emitter of transistor 415 via the resistors 414 and 416 in series, and the collector of transistor 415 is connected to the anode of diode 113 and the anode of diode 114. In addition, the connection point between the resistors 414 and 416 is connected to the positive power source +B via the resistor 110. Furthermore, the base of transistor 411 is connected to the input point P₁ between the resistors 108 and 109.

In this modified distortion cancellation circuit 4, there exists characteristics which varies in response to the frequency due to the capacitance of the capacitor 128 and the resistance of the resistor 412, namely, there exists low-cut filter characteristics determined by the capacitance and the resistance. The other operation and effect of the modified distortion cancellation circuit 4 are identical to those of the distortion cancellation circuit 4 shown in FIG. 2 and the detailed description thereof will be omitted.

Therefore, the cut-off region is set to lower than a predetermined region (an audio frequency band, for example), so that the distortion occurred in the predetermined region will be remarkably reduced.

In conclusion, the constitution of the power amplifier shown in FIG. 9 is more simple than that shown in FIG. 2.

Above is the detailed description of the preferred embodiments. This invention may be practiced or embodied in still other ways without departing from the spirit or essential character thereof. For example, the primary amplifier 5 can be omitted, and the constitutions of the drive amplifier 1, the output amplifier 3, the distortion cancellation circuit 4 and the negative feedback loop 6 are not limited to those described heretofore. The preferred embodiments described herein are therefore illustrative and not restrictive, the scope of the invention being indicated by the appended claims and all variations which come within the meaning of the claims are intended to be embraced therein.

What is claimed is:

1. A power amplifier circuit for an audio circuit comprising:
   (a) a drive amplifier having an impedance load, said drive amplifier driving said impedance load by use of a first power voltage from a first power source so that a first input voltage is amplified in said drive amplifier wherein the amplified first input voltage is outputted as a first output voltage;
   (b) an output amplifier being driven by said first output voltage so that said output amplifier outputs the amplified first output voltage as a second output voltage;
   (c) a distortion cancellation circuit for driving said impedance load with a voltage gain of "1" by use of a second power voltage from a second power source based on a first voltage difference between said first output voltage and said second output voltage, whereby a distortion included in said second output voltage is canceled by said distortion cancellation circuit; and
   (d) a negative feedback loop for negatively feeding back said second output voltage to a primary amplifier as a negative feedback voltage, said primary amplifier generating said first input voltage based on a second voltage difference between said negative feedback voltage and an arbitrary input voltage.

2. A power amplifier circuit according to claim 1, wherein said first power voltage is a predetermined negative voltage and said second power voltage is a predetermined positive voltage, absolute voltages of said first and second power voltages being set to the same voltage.

3. A power amplifier circuit according to claim 1, wherein said output amplifier is a push-pull amplifier including first and second transistors the types of which are different so as to perform a complementary operation with each other.

4. A power amplifier circuit according to claim 3, wherein each of said first and second transistors have bases and wherein the output voltage from said distortion cancellation circuit and said first output voltage are supplied respectively to the bases of said first and second transistors.

5. A power amplifier circuit according to claim 4, wherein said distortion cancellation circuit consists of a differential amplifier and a current mirror circuit, said differential amplifier generating a first current corresponding to said first voltage difference between said first and second output voltages, said current mirror circuit providing a second current identical to said first current into the base of said first transistor.

6. A power amplifier circuit according to claim 5, wherein said differential amplifier is a first such amplifier and said current mirror circuit is a first such circuit and said primary amplifier consists of a second differential amplifier and a second current mirror circuit, said second differential amplifier generating a third current corresponding to said second voltage difference between said negative feedback voltage from said negative feedback loop and said arbitrary input voltage, said second current mirror circuit outputting a fourth current identical to said third current into said drive amplifier so that said first input voltage is produced and inputted into said drive amplifier.

7. A power amplifier circuit according to claim 5 further including a bootstrap circuit, said bootstrap circuit prevents said first transistor within said output amplifier from being broken down when a voltage at a collector of a transistor included in said first current mirror circuit exceeds said second power voltage so that said first amplifier is subjected to a reverse bias state.

8. A power amplifier circuit according to claim 4, wherein said distortion cancellation circuit consists of a third transistor having a base, emitter and collector and a current mirror circuit, said first voltage difference between said first and second output voltages being applied between the base and the emitter of said third transistor so that a first current corresponding to said first voltage difference flows into the collector of said third transistor, said current mirror circuit outputting a second current identical to said first current into the base of said first transistor.

9. A power amplifier circuit according to claim 8, wherein said primary amplifier consists of a differential amplifier and a second current mirror circuit, said differential amplifier generating a third current corresponding to said second voltage difference between said negative feedback voltage from said negative feedback loop and said arbitrary input voltage, said second current mirror circuit outputting a fourth current identical to said third current into said drive amplifier so that said first input voltage is produced and inputted into said drive amplifier.

10. A power circuit according to claim 9 further including a bootstrap circuit, said bootstrap circuit preventing said first transistor within said output amplifier from being broken down when a voltage at a collector of a transistor included in said first current mirror circuit exceeds said second power voltage so that said first amplifier is subjected to a reverse bias state.

* * * * *